(12) United States Patent
Jung et al.

(10) Patent No.: US 7,480,980 B2
(45) Date of Patent: Jan. 27, 2009

(54) PLANAR MAGNETIC INDUCTOR AND METHOD FOR MANUFACTURING THE SAME

(75) Inventors: Hyung Mi Jung, Kyungki-do (KR); Jin Seok Moon, Kyungki-do (KR); Seok Bae, Seoul (KR); Mano Yasuhiko, Kyungki-do (KR)

(73) Assignee: Samsung Electro-Mechanics Co., Ltd., Kyungki-do (KR)

( * ) Notice: Subject to any disclaimer, the term of this patent is extended or adjusted under 35 U.S.C. 154(b) by 3 days.

(21) Appl. No.: 11/724,211

(22) Filed: Mar. 15, 2007

(65) Prior Publication Data

US 2007/0159287 A1 Jul. 12, 2007

Related U.S. Application Data

(62) Division of application No. 11/156,485, filed on Jun. 21, 2005, now abandoned.

(30) Foreign Application Priority Data

Jan. 7, 2005 (KR) ................... 2005-1833

(51) Int. Cl.
*H01F 7/06* (2006.01)

(52) U.S. Cl. ..................... 29/602.1; 336/200

(58) Field of Classification Search ............ 336/65, 336/83, 200, 206–208, 232; 29/602.1
See application file for complete search history.

(56) References Cited

U.S. PATENT DOCUMENTS 6,207,234 B1 * 3/2001 Jiang ................... 427/333
6,903,645 B2 * 6/2005 Mizoguchi et al. ........... 336/200
7,034,646 B2 4/2006 Yamamoto et al.
7,061,359 B2 6/2006 Ding et al.
2004/0108934 A1 6/2004 Choi et al.

FOREIGN PATENT DOCUMENTS

| JP | 63-283004 | 11/1988 |
|---|---|---|
| JP | 2-123706 | 5/1990 |
| JP | 7-213027 | 8/1995 |
| JP | 9-232174 | 9/1997 |
| JP | 2000-182872 | 6/2000 |
| JP | 2000-252121 | 9/2000 |
| JP | 2001-185419 | 7/2001 |
| JP | 2002-299122 | 10/2002 |
| JP | 2002-299138 | 10/2002 |
| JP | 2004-111545 | 4/2004 |
| KR | 2003-0020603 | 3/2003 |

* cited by examiner

*Primary Examiner*—Tuyen T. Nguyen
(74) *Attorney, Agent, or Firm*—McDermott Will & Emery LLP

(57) ABSTRACT

A planar magnetic inductor and a method for manufacturing the same are provided. The planar magnetic inductor comprises an insulating oxide magnetic layer formed on a substrate, a conductive coil separated from a lower surface of the insulating oxide magnetic layer while being completely embedded in the insulating oxide magnetic layer, and a cover layer formed on the insulating oxide magnetic layer for protecting the insulating oxide magnetic layer. The insulating oxide magnetic layer comprises a lower insulating oxide magnetic layer, and an upper insulating oxide magnetic layer formed on the lower insulating oxide magnetic layer, such that the conductive coil is completely embedded in the upper insulating oxide magnetic layer. The planar magnetic inductor can realize excellent high frequency characteristics and high inductance with a reduced scale.

8 Claims, 6 Drawing Sheets

(a)

(b)

(c)

(d)

(12)  United States Patent

PLANAR MAGNETIC INDUCTOR AND METHOD FOR MANUFACTURING THE SAME

RELATED APPLICATIONS

The present invention is a divisional of U.S. application Ser. No. 11/156,485, filed on Jun. 21, 2005 now abandoned, which is based on, and claims priority from, Korean Application Number 2005-1833, filed Jan. 7, 2005, the disclosures of which are incorporated by reference herein in their entirety.

BACKGROUND OF THE INVENTION

1. Field of the Invention

The present invention generally relates to a planar inductor and a method for manufacturing the same, and, in particular, to a planar magnetic inductor, which can realize excellent high frequency characteristics and enhanced inductance with a reduced scale, and a method for manufacturing the same.

2. Description of the Related Art

Inductors have been used for various applications, such as low noise amplifiers, mixers, voltage control oscillators, matching coils, and the like. In particular, a planar inductor is an inductor realized by a conductive coil of a thin film formed on a substrate. Such a planar inductor can be applied to, for example, a DC-DC converter or a noise filter.

Recently, technology has been developed for formation of a magnetic substance together with a conductive coil of a thin film on a substrate in order to enhance performance of the planar inductor. The performance of the planar magnetic inductor is significantly dependent on the properties of the magnetic substance, such as soft magnetic ferrite used for the inductor. The magnetic substance must have a sufficiently high permeability in a high frequency region upon application of high frequency, be prevented from being thermally and mechanically deteriorated during a process of manufacturing the inductor, and be insulated from the conductive coil. Korean Patent Laid-open Publication No. 2003-0020603 discloses technology for manufacturing a thin film inductor in which a dielectric layer is formed between a copper coil and a soft magnetic layer.

FIG. 1 is a schematic cross-sectional view illustrating the construction of a conventional planar magnetic inductor 100. Referring to FIG. 1, the conventional planar magnetic inductor 100 comprises a lower soft magnetic layer 12, a lower dielectric layer 14, a coil-shaped seed layer pattern 16a, and a conductive coil 18 sequentially formed on a substrate 11. An upper soft magnetic layer 24 is formed on the conductive coil 18. These soft magnetic layers 12 and 24 are formed of a Fe or Co-based soft magnetic thin film, and thus have a low specific resistance. Accordingly, in order to prevent electrical short circuit between adjacent lines of the conductive coil 18, a non-magnetic dielectric layer 22 of epoxy or $SiO_2$ is formed, as shown in FIG. 1, in a gap between the lines of the conductive coil 18, and a non-magnetic dielectric layer 14 is also formed under the conductive coil 18. As a result, the overall thickness of the inductor 100 is relatively thickened due to the dielectric layers 14 and 22.

FIGS. 2a to 2d are cross-sectional views illustrating a method for manufacturing the conventional planar magnetic inductor. First, as shown in FIG. 2a, a Fe or Co-based lower soft magnetic layer 12, and a lower dielectric layer 14 are deposited on an insulating substrate 11. Then, as shown in FIG. 2b, a plating seed layer 16 comprising Ni or the like is formed on the lower dielectric layer 14. Then, as shown in FIG. 2c, a conductive coil 18 is formed, and a seed layer pattern 16a is formed to have the same pattern as that of the conductive coil 18 by selectively etching the plating seed layer 16. Next, as shown in FIG. 2d, after an upper dielectric layer 22 is thickly formed, and is flattened such that the conductive coil 18 is completely embedded therein, a Fe or Co-based upper soft magnetic layer 24 is formed thereon. As a result, the sandwich-type planar magnetic inductor 100 is completed.

In the conventional process described above, since the Fe or Co-based upper soft magnetic layers 12 and 24 have a lower specific resistance, the insulating layer 22 formed of oxide or nitride is formed in order to prevent electrical short circuit between the lines of the conductive coil 18. As such, when the insulating layer 22 is formed between the lines of the conductive coil 18, the substrate is exposed to heat generated upon forming the insulating layer 22, causing the magnetic properties of the lower soft magnetic layer 12 to be deteriorated. As a result, bonding strength between the insulating layer 22 and the conductive coil 18 is lowered, thereby causing delamination. Furthermore, since the insulating layer 22 is formed to have a predetermined thickness or more for sufficient electrical insulation, the conductive coil 18 is separated a significant distance from the soft magnetic layers 12 and 24, thereby reducing the inductance and deteriorating high frequency characteristics. Additionally, the overall thickness of the inductor element is increased due to the insulating layers 14 and 22.

SUMMARY OF THE INVENTION

The present invention has been made to solve the above problems, and it is an object of the present invention to provide a planar magnetic inductor, which can realize excellent high frequency characteristics and enhanced inductance with a reduced scale.

It is another object of the present invention to provide a method for manufacturing a planar magnetic inductor, which can realize excellent high frequency characteristics and enhanced inductance.

In accordance with one aspect of the present invention, the above and other objects can be accomplished by the provision of a planar magnetic inductor, comprising: an insulating oxide magnetic layer formed on a substrate; a conductive coil separated from a lower surface of the insulating oxide magnetic layer while being completely embedded in the insulating oxide magnetic layer; and a cover layer formed on the insulating oxide magnetic layer for protecting the insulating oxide magnetic layer.

The insulating oxide magnetic layer may comprise a lower insulating oxide magnetic layer formed on the substrate, and an upper insulating oxide magnetic layer formed on the lower insulating oxide magnetic layer. In this case, the conductive coil is formed on the lower insulating oxide magnetic layer, and can be completely embedded in the upper insulating oxide magnetic layer.

The insulating oxide magnetic layer may comprise an oxide magnetic material comprising at least two elements selected from the group comprising Fe, Ni, Zn, Mn, Mg, Co, Ba and Sr. For example, the insulating oxide magnetic layer may be formed of Ni—Zn ferrite. The insulating oxide magnetic layer comprising the elements as described above has a higher specific resistance, thereby exhibiting sufficient insulating properties together with high magnetic permeability.

The insulating oxide magnetic layer may be formed by ferrite plating. When the insulating oxide magnetic layer is formed by ferrite plating, this process is performed at a lower temperature of about 100° C. or less, and thus the substrate or the conductive coil is not substantially subjected to thermal deterioration, and the variety of materials which may be used to fabricate the substrate is increased.

The cover layer may comprise a material selected from a polymeric material, ceramic material, glass, silicone, or a combination thereof. In particular, the cover layer may comprise the polymeric material, such as highly chemically resistant polyimide. The cover layer serves to protect the insulating oxide magnetic layer from damage due to external impact or contact with foreign matter. By means of the cover layer, the planar magnetic inductor can be easily and safely manipulated.

The conductive coil may be a spiral coil made of copper. The conductive coil may be formed by electroplating. In this case, the planar magnetic inductor may further comprise a plating seed layer pattern having the same pattern as that of the conductive coil and formed underneath the conductive coil.

In accordance with another aspect of the invention, a method for manufacturing a planar magnetic inductor is provided, comprising: forming a lower insulating oxide magnetic layer on a substrate; forming a conductive coil on the lower insulating oxide magnetic layer; forming an upper insulating oxide magnetic layer directly on the conductive coil such that the conductive coil is completely embedded in the upper insulating oxide magnetic layer; and forming a cover layer on the upper insulating oxide magnetic layer. The upper and lower insulating oxide magnetic layers may comprise an oxide magnetic material comprising at least two elements selected from the group comprising Fe, Ni, Zn, Mn, Mg, Co, Ba and Sr.

Formation of the conductive coil may be performed by an electroplating method. In this case, formation of the conductive coil may comprise forming a coil-shaped photoresist layer pattern on the lower insulating oxide magnetic layer, forming a coil-shaped plating seed layer pattern by use of the photoresist pattern, and forming a conductive coil on the plating seed layer pattern by electroplating. The plating seed layer pattern may comprise nickel, and the conductive coil may comprise copper.

As another approach for forming the conductive coil using the electroplating method, formation of the conductive coil may comprise forming a plating seed layer on the lower insulating oxide magnetic layer, forming a photoresist layer mold having a coil-shaped pattern on the plating seed layer, forming the conductive coil by electroplating using the photoresist layer mold as a mask, and removing the photoresist layer mold and a portion of the plating seed layer under the photoresist layer mold.

Formation of the conductive coil may comprise cladding a metallic thin film onto the lower insulating oxide magnetic layer by compression, and performing selective chemical etching on the metallic thin film to form a coil pattern.

Formation of the conductive coil may be performed by a screen printing method. That is, after forming a screen for a coil pattern on the lower insulating oxide magnetic layer, a conductive paste is printed using the screen as a print mask, thereby allowing the conductive pattern to be formed on the substrate.

Formation of the conductive coil may be performed by an ink-jet printing method. That is, after printing a conductive paste in a slurry state on the lower insulating oxide magnetic layer, the conductive pattern can be directly formed on the substrate without a screen.

The present invention provides the method for enhancing the high frequency characteristics and the inductance of the planar magnetic inductor while further reducing the thickness thereof. For this purpose, instead of forming the non-magnetic insulating layer formed of the oxide or nitride dielectric material between the lines of the conductive coil, the conductive coil is embedded in the insulating oxide magnetic material. As such, since the process of forming the non-magnetic insulating layer is eliminated in the present invention, the problems of deterioration in the magnetic properties due to the heat generated during formation of the non-magnetic insulating layer, creation of residual stress, and weakening of the bonding strength between the thin films can be solved.

BRIEF DESCRIPTION OF THE DRAWINGS

The foregoing and other objects and features of the present invention will be more clearly understood from the following detailed description taken in conjunction with the accompanying drawings, in which.

DESCRIPTION OF THE PREFERRED EMBODIMENTS

Figure 1:
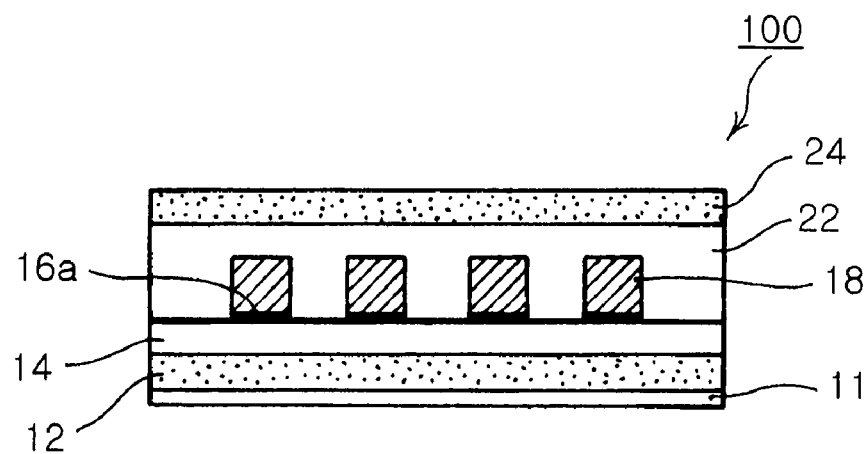
FIG. 1 is a cross-sectional view illustrating a conventional planar magnetic inductor.

Preferred embodiments will now be described in detail with reference to the accompanying drawings. It should be noted that the embodiments of the invention can be modified in various shapes, and that the present invention is not limited to the embodiments described herein. The embodiments of the invention are described so as to enable those having an ordinary knowledge in the art to have a perfect understanding of the invention. Accordingly, shape and size of components of the invention are enlarged in the drawings for clear description of the invention. Like components are indicated by the same reference numerals throughout the drawings.

Figure 3:
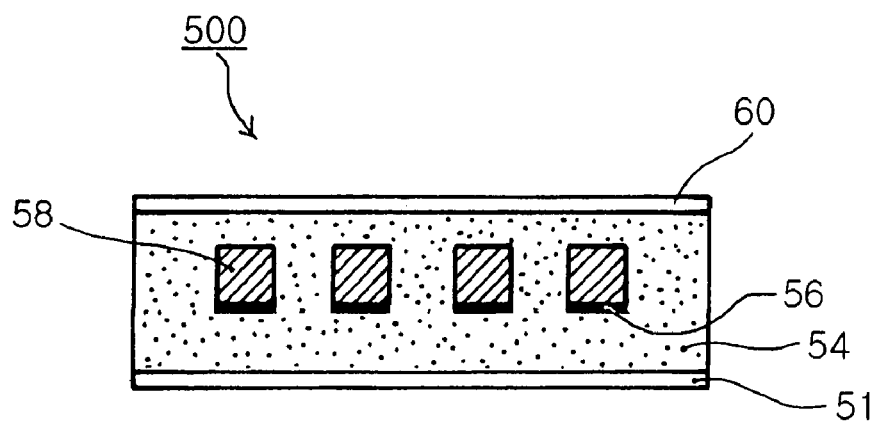
FIG. 3 is a cross-sectional view illustrating a planar magnetic inductor in accordance with one embodiment of the present invention.

FIG. 3 is a cross-sectional view illustrating a planar magnetic inductor 500 in accordance with one embodiment of the invention. Referring to FIG. 3, an insulating oxide magnetic layer 54 is formed on a substrate 51, and a conductive coil 58 is completely embedded in the insulating oxide magnetic layer 54. The conductive coil 58 is separated from a lower surface of the insulating oxide magnetic layer 54, so that the insulating oxide magnetic layer 54 is present under the conductive coil 58. A cover layer 60 is formed on the insulating oxide magnetic layer 54 to protect the insulating oxide magnetic layer 54 from damage due to external impact or contact with foreign matter. The conductive coil 58 is formed via electroplating, and is formed with a conductive seed layer pattern 56 under the conductive coil 58. In addition to electroplating, the conductive coil 58 may be formed by various methods, such as screen printing, cladding of a metallic thin film, and the like, as described below. In particular, when the conductive coil 58 is formed by screen printing or cladding of the metallic thin film, the conductive seed layer pattern 56 is not required. In order to secure a lower specific resistance and a sufficient inductance, the conductive coil 58 may be a spiral coil made of copper. The conductive coil 58 may have various shapes, including a rectangular shape, a square shape, a circular shape, etc.

Figure 2:
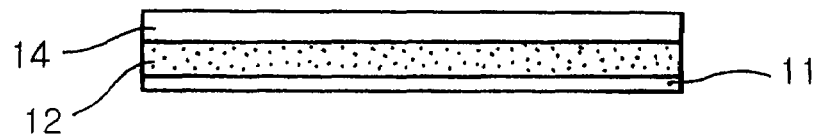
FIGS. 2a to 2d are cross-sectional views illustrating a method for manufacturing the conventional planar magnetic inductor.
Figure 2:
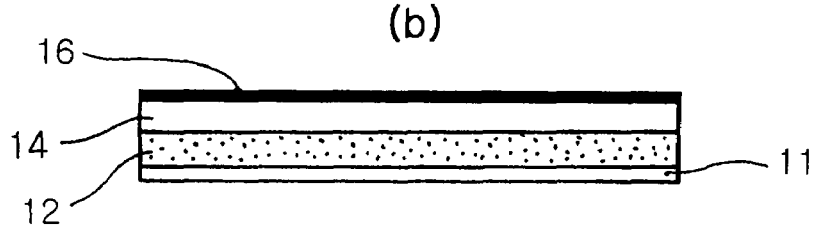
Figure 2:
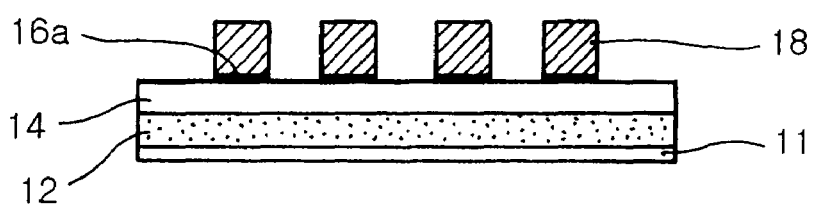
Figure 2:
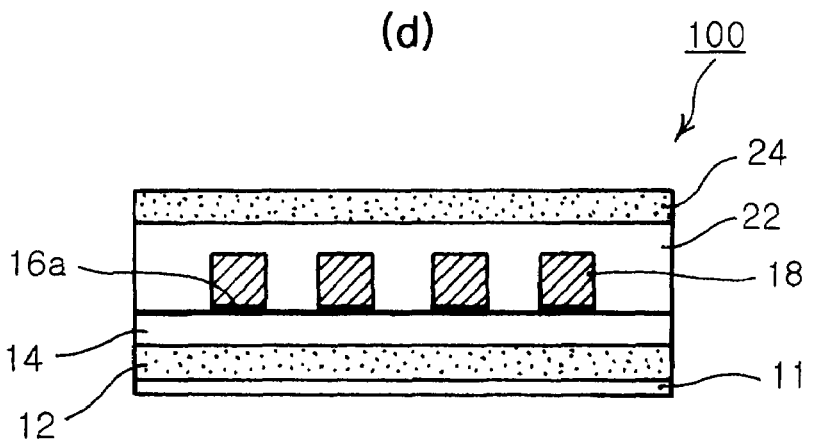

Unlike the conventional magnetic inductor, the planar magnetic inductor 500 constructed as described above is not provided with a separate non-magnetic insulating layer 14 or 22 (see FIG. 2). Instead, the planar magnetic inductor 500 of the invention employs an insulating oxide magnetic material as a material for the insulating oxide magnetic layer 54 in order to insulate lines of the conductive coil 58 from each other. The insulating oxide magnetic layer 54 may be formed of the oxide magnetic material comprising at least two elements selected from the group comprising Fe, Ni, Zn, Mn, Mg, Co, Ba and Sr. Since such an insulating oxide magnetic layer 54 has a higher specific resistance than the conventional metallic soft magnetic layers, the insulating oxide magnetic layer 54 exhibits sufficient electrical insulation. Accordingly, the insulating oxide magnetic layer 54 directly contacts the conductive coil 58, and provides the sufficient electrical insulation between the adjacent lines of the conductive coil 58. The insulating oxide magnetic layer 54 can exhibit high magnetic permeability together with the sufficient insulating properties. Since such an insulating oxide magnetic layer 54 contacts the conductive coil 58 completely embedded therein, the planar magnetic inductor 500 has an excellent quality factor while exhibiting high inductance. Moreover, since the planar magnetic inductor 500 is not provided with the separate non-magnetic insulating layer 14 or 22 (see FIG. 1), the thickness of the inductor 500 can be reduced, resulting in reduction in size of the inductor element.

The insulating oxide magnetic layer 54 may have a two-layer structure as described below. That is, the insulating oxide magnetic layer 54 may comprise a lower insulating oxide magnetic layer 52 (see FIG. 9) formed between the substrate 51 and the plating seed layer pattern 56, and an upper insulating oxide magnetic layer 53 (see FIG. 9) formed on the lower insulating oxide magnetic layer 52 such that the conductive coil 58 is completely embedded in the upper insulating oxide magnetic layer 53. The cover layer 60 formed on the insulating oxide magnetic layer 54 serves to protect the insulating oxide magnetic layer 54 from damage due to external impact or contact with foreign matter, and comprises, for example, a highly chemically resistant polyimide.

FIGS. 4 to 9 are cross-sectional views illustrating a method for manufacturing a planar magnetic inductor in accordance with one embodiment of the invention. In the present embodiment, the conductive coil is formed via electroplating.

Figure 4:
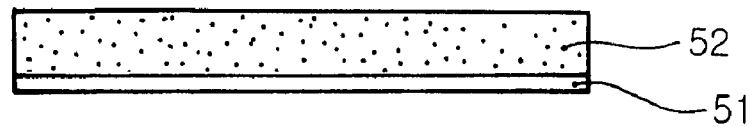
FIGS. 4 to 9 are cross-sectional views illustrating a method for manufacturing a planar magnetic inductor in accordance with one embodiment of the present invention.

First, referring to FIG. 4, a lower insulating oxide magnetic layer 52 is formed on a substrate 51 formed of polyimide or FR4. The lower insulating oxide magnetic layer 52 may comprise an oxide magnetic material comprising at least two elements selected from the group comprising Fe, Ni, Zn, Mn, Mg, Co, Ba and Sr. For example, the lower insulating oxide magnetic layer 52 may be formed of Ni—Zn ferrite. Since the lower insulating oxide magnetic layer 52 has the high specific resistance, it exhibits sufficient electrical insulation.

Figure 5:
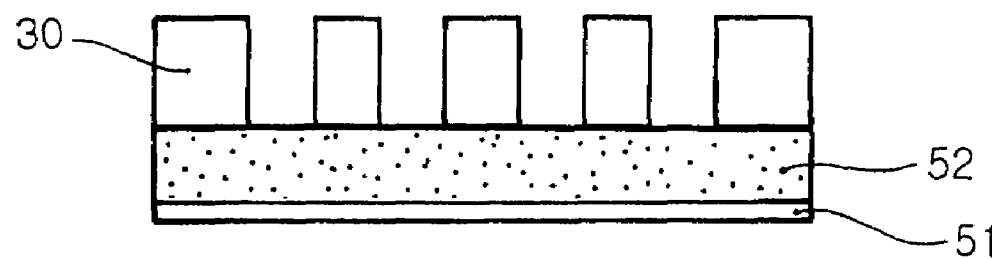

Next, referring to FIG. 5, a coil-shaped photoresist layer pattern 30 is formed on the lower insulating oxide magnetic layer 52. The photoresist layer pattern 30 may be formed through well-known exposure and developing processes. A portion of the lower insulating oxide magnetic layer 52 exposed through the photoresist layer pattern 30 constitutes a region on which a plating seed layer pattern is formed by a subsequent process.

Figure 6:
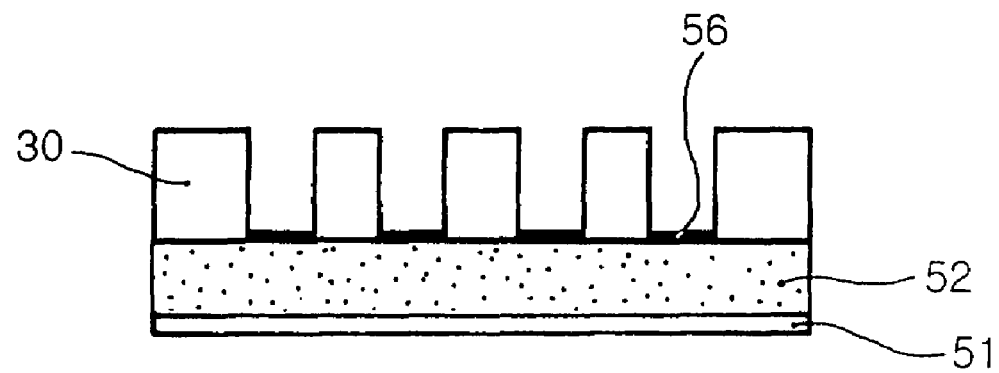

Then, as shown in FIG. 6, a nickel plated layer is formed on the portion of the lower insulating oxide magnetic layer 52 exposed through the photoresist layer pattern 30 via electroless plating using the photoresist layer pattern 30 as a mask. Accordingly, a coil-shaped plating seed layer pattern 56 comprising nickel is formed on the lower insulating oxide magnetic layer 52. The plating seed layer pattern 56 serves as a seed layer for forming a conductive coil in a subsequent process.

Figure 7:
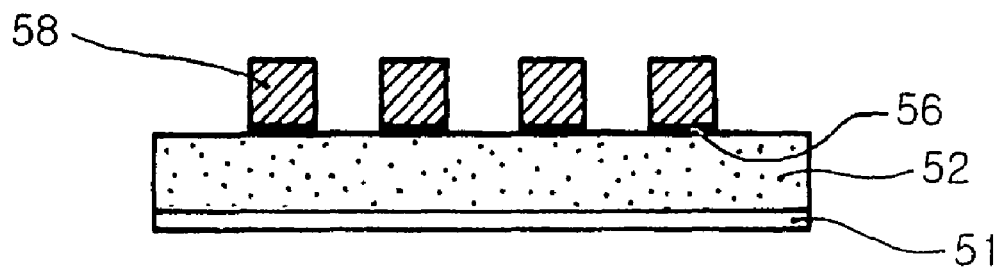

Then, referring to FIG. 7, a copper plated layer is formed on the plating seed layer pattern 56 via electroplating using the plating seed layer pattern 56. As a result, a conductive coil 58 formed of copper is formed on the plating seed layer pattern 56. As described above, since the lower insulating oxide magnetic layer 52 has the high specific resistance, the lines of the conductive seed layer pattern 56 are insulated from each other even if the plating seed layer pattern 56 and the conductive coil 58 are directly formed on the lower insulating oxide magnetic layer 52.

Figure 8:
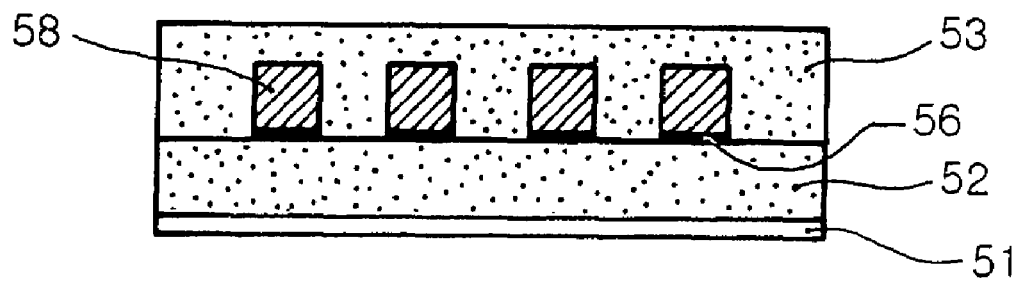

Then, referring to FIG. 8, an upper insulating oxide magnetic layer 53 is formed over the resultant conductive coil 58, such that the conductive coil 58 is completely embedded in the upper insulating oxide magnetic layer 53. Preferably, in order to enhance bonding force between the conductive coil 58 and the upper insulating oxide magnetic layer 53, a surface of the conductive coil 58 is roughened by a soft etching process before forming the upper insulating oxide magnetic layer 53. As with the lower insulating oxide magnetic layer 53, the upper insulating oxide magnetic layer 53 may comprise an oxide magnetic material comprising at least two elements selected from the group comprising Fe, Ni, Zn, Mn, Mg, Co, Ba and Sr. For example, the upper insulating oxide magnetic layer 53 may be formed of Ni—Zn ferrite. As such, since the upper and lower insulating oxide magnetic layers 53 are formed of the insulating oxide magnetic material, the lines of the conductive coil 58 are insulated from each other.

Figure 9:
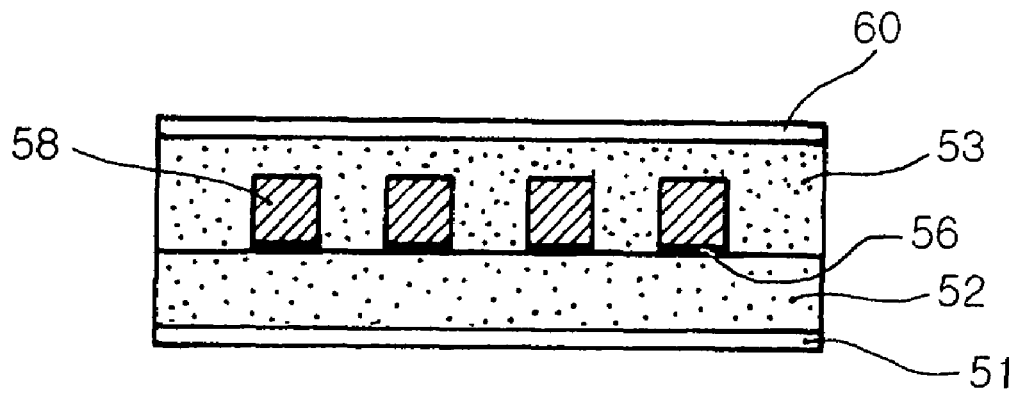

Finally, as shown in FIG. 9, a cover layer 60 of polyimide is formed on the upper insulating oxide magnetic layer 53, thereby completing the planar magnetic inductor according to the embodiment of the invention. The cover layer 60 serves to protect the insulating oxide magnetic layers 52 and 53. The cover layer 60 is preferably formed of a polymer having chemical resistance. For example, the cover layer 60 may be formed of polyimide or epoxy. In addition to these materials, the cover layer 60 may be formed of a polymeric material, a ceramic material, a glass, a silicone-based material, or a combination thereof.

In this embodiment, the upper and lower insulating oxide magnetic layers 52 and 53 are formed by ferrite plating. The ferrite plating method is a method for forming an oxide magnetic material layer by use of an oxidizing solution, which is a raw material of the upper and lower insulating oxide magnetic layers 52 and 53, and of a reaction solution containing a metallic element. For example, after the oxidizing solution and the reaction solution are formed into liquid droplets, the liquid droplets are sprayed onto the substrate, thereby forming the oxide magnetic layer. With such a ferrite plating method, the insulating oxide magnetic layers 52 and 53 can be formed at a low temperature of about 100° C. or less. Accordingly, when forming the insulating oxide magnetic layers 52 and 53, the substrate 51 or the conductive coil 58 is not substantially subjected to thermal deterioration, and the variety of materials which may be used to fabricate the substrate 51 is increased. Moreover, with the ferrite plating method, since the thickness of the insulating oxide magnetic layers 52 and 53 is easily controlled, the insulating oxide magnetic layers 52 and 53 can be formed to have a uniform thickness.

According to the method described above, the non-magnetic insulating layers are not formed between the lines of the conductive coil 54. Instead, the insulating oxide magnetic layers 52 and 53 are formed such that the overall conductive coil 54 is embedded therein. The insulating oxide magnetic layers 52 and 53 exhibit high specific resistance and permeability. Accordingly, the lines of the conductive coil 58 are sufficiently insulated from each other, whereby leakage current between interior conductors can be prevented while eddy currents are suppressed. As a result, the inductance L and the quality factor Q of the planar magnetic inductor of the invention are enhanced, while realizing excellent high frequency characteristics. Moreover, since the non-magnetic layer is not separately formed, the problems (for example, deterioration of the characteristics of the magnetic layers, weakening of the bonding force between the thin films due to difference in thermal expansion coefficient upon cooling, and. delamination) caused by high temperature during the process of forming the non-magnetic layer are suppressed, thereby enhancing reliability of the inductor element. Additionally, since the thick insulating layer 22 (see FIG. 1) is not formed, the inductor element can be reduced in size.

FIGS. 10 to 14 are cross-sectional views illustrating a method for manufacturing a planar magnetic inductor in accordance with another embodiment of the invention.

Figure 10:
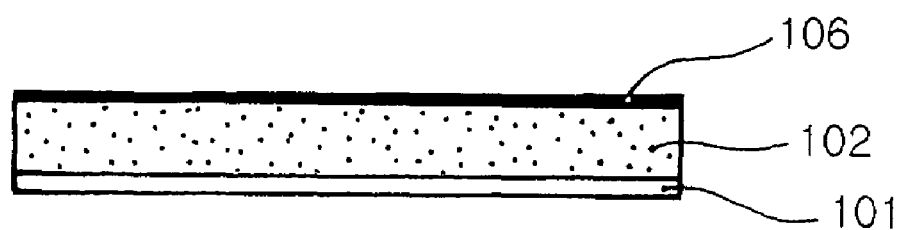
FIGS. 10 to 14 are cross-sectional views illustrating a method for manufacturing a planar magnetic inductor in accordance with another embodiment of the present invention.

First, referring to FIG. 10, a lower insulating oxide magnetic layer 102 is formed on a substrate 101 via ferrite plating. Then, a plating seed layer 106 is formed on the lower insulating oxide magnetic layer 102 via electroless plating. The lower insulating oxide magnetic layer 102 is formed of the same material as that of the insulating oxide magnetic layers 52 and 53 described above.

Figure 11:
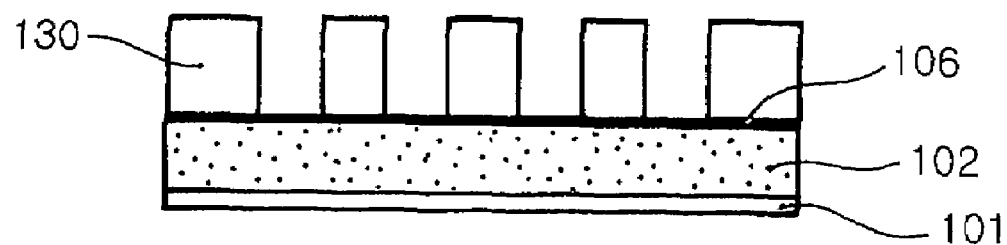

Then, as shown in FIG. 11, a coil-shaped photoresist layer mold 130 is formed on the plating seed layer 106. A portion of the plating seed layer 106 exposed through the photoresist layer mold 130 constitutes a region on which a conductive coil is formed by a subsequent process. The photoresist layer mold 130 can be formed by exposing and developing the plating seed layer 106 through a coil-shaped photo-mask after depositing a photoresist layer on the plating seed layer 106.

Figure 12:
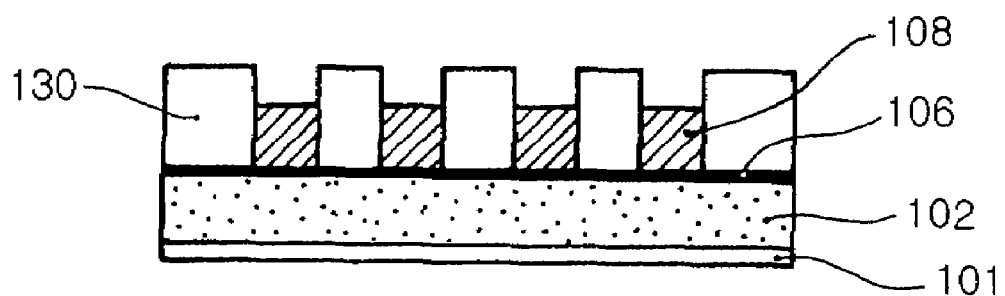

Then, as shown in FIG. 12, a copper plated layer is formed on portion of the plating seed layer 106 exposed through the photoresist layer mold 130 via electroplating using the photoresist layer mold 130. As a result, a conductive coil 108 of the copper plated layer is formed thereon. At this time, the conductive coil 108 is formed to a thickness of about 50 μm via electroplating using a plating solution containing, for example, copper sulfate ($CuSO_4$).

Figure 13:
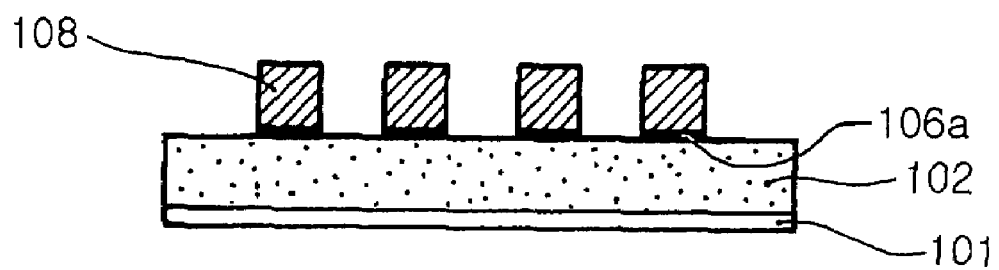

Then, referring to FIG. 13, the photoresist layer mold 130 is removed by use of a stripper, and a portion of the plating seed layer 106 (a portion of the seed layer 160 to which copper is not plated) directly under the mold 130 is also removed by means of an etching solution. As a result, a coating seed layer pattern 106a is formed to have the same coil pattern as that of the conductive coil 108.

Figure 14:
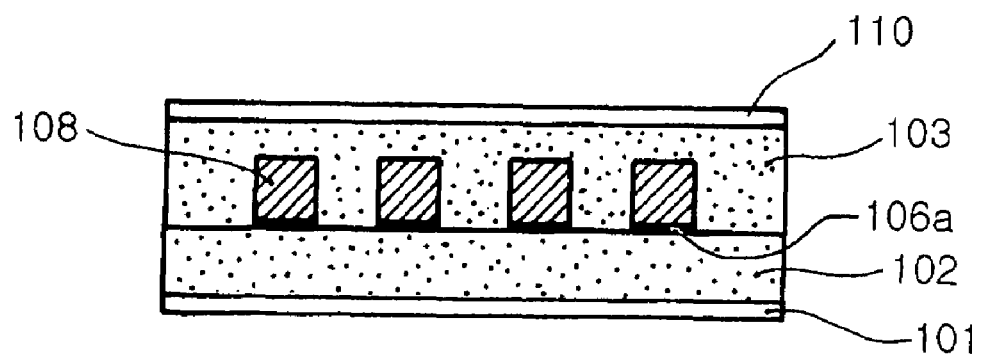

Then, as shown in FIG. 14, an upper insulating oxide magnetic layer 103 is formed over the resultant conductive coil 108 via ferrite plating. Thus, the conductive coil 108 is completely embedded in the upper insulating oxide magnetic layer 103. In order to enhance bonding force between the conductive coil 108 and the upper insulating oxide magnetic layer 103, the surface roughness of the conductive coil 108 is increased through soft etching before the upper insulating oxide magnetic layer 103 is formed. Finally, a cover layer 110 of polyimide is formed on the upper insulating oxide magnetic layer 103 in order to protect the lower and upper insulating oxide magnetic layers 102 and 103 from being damaged, thereby completing the planar magnetic inductor.

In the embodiments described above, the conductive coils 58 and 108 are formed via electroplating. However, it should be appreciated that the present invention is not limited to this method, and that the conductive coil of the invention may be formed by other methods. For example, the conductive coil of the invention may be formed by cladding of a metallic thin film, screen printing, or ink-jet printing.

Figure 15:
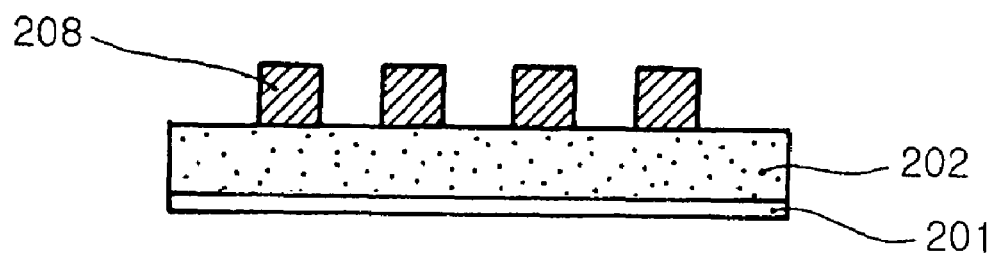
FIGS. 15 and 16 are cross-sectional views illustrating a method for manufacturing a planar magnetic inductor in accordance with still another embodiment of the present invention.
Figure 16:
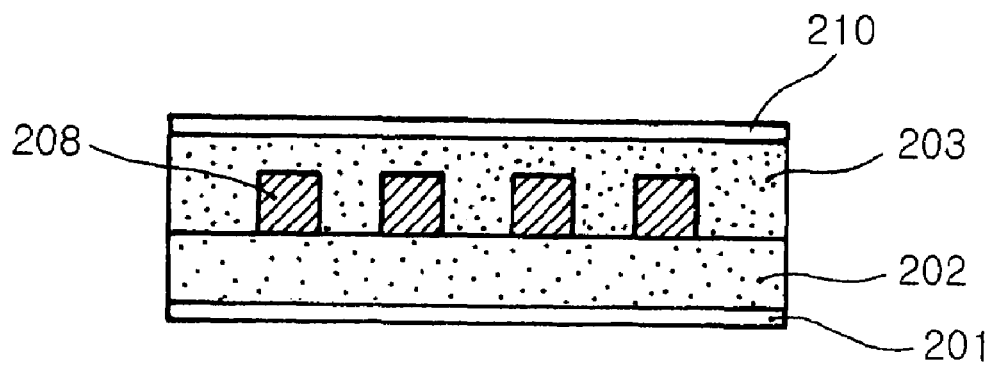

FIGS. 15 and 16 are cross-sectional views illustrating a method for manufacturing a planar magnetic inductor in accordance with still another embodiment of the invention. In this embodiment, the plating seed layer is not used.

First, referring to FIG. 15, a conductive coil 208 of copper is formed on a lower insulating oxide magnetic layer 202 formed on a substrate 201. The conductive coil 208 is formed via compressing and cladding, for example, a copper thin film onto the lower insulating oxide magnetic layer, and then selectively etching the copper thin film. Selective etching can be performed by use of well-known photolithography methods. That is, after forming a photoresist layer (not shown) having a coil pattern on a copper thin film attached to the substrate 201, the copper thin film is etched with an etching solution, such as $FeCl_3$, through the photoresist layer used as an etching mask. As a result, the conductive coil 208 formed of copper is achieved as shown in FIG. 15.

Alternatively, a conductive coil 208 may be formed via screen printing. That is, after forming a screen having a pattern opposite to the coil pattern of the conductive coil on the lower insulating oxide magnetic layer 202, a conductive paste is printed on the lower insulating oxide magnetic layer 202 by use of the screen as a print mask, and is then dried, thereby forming the conductive pattern 208. As such, as the conductive coil 208 is formed by cladding of the metallic thin film or screen printing, there is no need to separately form the coating seed layer.

Alternatively, a conductive coil 208 may be formed via ink-jet printing. That is, after printing a conductive paste in a slurry state on the lower insulating oxide magnetic layer 202 by the ink-jet printing method, the conductive pattern 208 can be directly formed on the substrate without a screen.

Then, as shown in FIG. 16, an upper insulating oxide magnetic layer 203 is formed on the resultant conductive coil 208 so as to allow the conductive coil 208 to be completely embedded in the upper insulating oxide magnetic layer 203. Finally, a cover layer 210 of polyimide is formed on the upper insulating oxide magnetic layer 203, so that the planar magnetic inductor is completed.

Characteristics of the planar magnetic inductor according to the invention will be described in detail with reference to examples.

EXAMPLES

Inventive Example

In an inventive example, a plating seed layer of nickel was formed by electroless plating, and was then subjected to electroplating, thereby forming a conductive copper coil (see FIGS. 4 to 9. First, a Ni—Zn ferrite layer was formed to a thickness of about 10 μm on a polyimide substrate 51 by a ferrite plating method of a spin spray type. This Ni—Zn ferrite layer became a lower insulating oxide magnetic layer 52. Then, a plating seed layer pattern 56 comprising nickel was formed on the Ni—Zn ferrite layer by electroless plating, and a copper plated layer was formed to a thickness of about 50 μm on the plating seed layer pattern 56 via electroplating. The copper plated layer became a conductive coil pattern 58. Then, an upper insulating oxide magnetic layer 52 comprising a Ni—Zn ferrite layer was formed to a thickness of about 60 μm on the coil pattern 58 to allow the conductive coil pattern 58 to be completely embedded therein. A cover layer 60 was formed by stacking a polyimide layer on the magnetic layer 53 to a thickness of about 35 μm, thereby completing the planar magnetic inductor. The planar magnetic inductor has dimensions of 5.0 mm×5.0 mm.

Comparative Example

As a comparative example, a conventional planar magnetic inductor was manufactured (see FIGS. 2a to 2d), and the properties thereof were compared with those of the planar magnetic inductor of the inventive example. First, a lower soft magnetic layer 12 having a double-film structure of FeTaN/Ti was formed on an FR4 insulating substrate 11, and a lower insulating layer 14 comprising $SiO_2$ was formed to a thickness of 1 μm thereon. A plating seed layer 12 comprising nickel was formed on the lower insulating layer 14, and then a conductive copper coil 18 was formed to a thickness of about 50 μm thereon by use of a photoresist layer mold and the electroplating method. An upper insulating layer 22 comprising $SiO_2$ was formed on the conductive coil 18 so as to allow the conductive coil 18 to be completely embedded therein. Then, an upper soft magnetic layer 24 comprising the same material as that of the lower soft magnetic layer 12 was formed thereon, thereby completing the conventional planar magnetic inductor. The conventional planar magnetic inductor has dimensions of 5.3 mm×6.3 mm.

In order to compare the properties of the inductors of the inventive example and the comparative example, the inductances and the quality factors thereof were measured. The quality factors were measured at an operating frequency of 1MHz. Results of the measurements are listed in the following Table 1.

TABLE 1

| Properties | Inventive Example | Comparative Example |
|---|---|---|
| Inductance μH | 1.855 | 0.990 |
| Quality factor | 30 | 3.5 |
| Size (mm × mm) | 5.0 × 5.0 | 5.3 × 6.5 |

As shown in Table 1, the planar magnetic inductor of the inventive example exhibits higher inductance and quality factor than the comparative example. Accordingly, the planar magnetic inductor of the inventive example can be employed as an inductor for a power supplier, and can exhibit excellent high frequency characteristics in RF applications.

As apparent from the above description, unlike the conventional planar magnetic inductor having the non-magnetic insulating layer formed between the lines of the conductive coil, the insulating oxide magnetic layer of the invention is formed to completely embed the conductive coil therein, thereby realizing excellent high frequency characteristics and high inductance. Moreover, since the planar magnetic inductor of the invention is not formed with the non-magnetic insulating layer, the problems of deterioration in the magnetic properties due to heat generated during formation of the non-magnetic insulating layer, creation of residual stress, and weakening of bonding strength between the thin films can be prevented. Accordingly, the frequency of defective inductor can be reduced, while reliability of the inductor element can be enhanced.

Furthermore, since formation of the non-magnetic insulating layer is omitted, the total number of processes is decreased, thereby reducing manufacturing costs and time as well as reducing the thickness of the planar inductor.

It should be understood that the embodiments and the accompanying drawings have been described for illustrative purposes and the present invention is limited by the following claims. Further, those skilled in the art will appreciate that various modifications, additions and substitutions are allowed without departing from the scope and spirit of the invention as set forth in the accompanying claims.

What is claimed is:

1. A method for manufacturing a planar magnetic inductor is provided, comprising:
   forming a lower insulating oxide magnetic layer on a substrate;
   forming a conductive coil on the lower insulating oxide magnetic layer;
   forming an upper insulating oxide magnetic layer directly on the conductive coil such that the conductive coil is completely embedded in the upper insulating oxide magnetic layer; and
   forming a cover layer on the upper insulating oxide magnetic layer,
   wherein the lower and the upper insulating oxide magnetic layers are formed by ferrite plating.

2. The method as set forth in claim 1, wherein the upper and lower insulating oxide magnetic layers comprise an oxide magnetic material comprising at least two elements selected from the group comprising Fe, Ni, Zn, Mn, Mg, Co, Ba and Sr.

3. The method as set forth in claim 1, wherein the conductive coil is formed by electroplating.

4. The method as set forth in claim 3, wherein formation of the conductive coil comprises:
   forming a coil-shaped photoresist layer pattern on the lower insulating oxide magnetic layer;
   forming a coil-shaped plating seed layer pattern by use of the photoresist pattern; and
   forming the conductive coil on the plating seed layer pattern by electroplating.

5. The method as set forth in claim 3, wherein formation of the conductive coil comprises:
   forming the plating seed layer on the lower insulating oxide magnetic layer;
   forming a photoresist layer mold having a coil-shaped pattern on the plating seed layer;
   forming the conductive coil by electroplating using the photoresist layer mold as a mask; and
   removing the photoresist layer mold and a portion of the plating seed layer under the photoresist layer mold.

6. The method as set forth in claim 1, wherein formation of the conductive coil comprises:
   cladding a metallic thin film onto the lower insulating oxide magnetic layer by compression;
   and performing selective chemical etching on the metallic thin film to form a coil pattern.

7. The inductor as set forth in claim 1, wherein formation of the conductive coil comprises:
   forming a screen for a coil pattern on the lower insulating oxide magnetic layer; and
   printing a conductive paste on the lower insulating oxide magnetic layer by using the screen as a print mask.

8. The method as set forth in claim 1, wherein formation of the conductive coil comprises:
   printing a conductive paste in a slurry state on the lower insulating oxide magnetic layer by ink-jet printing.

* * * * *